United States Patent
Krivanek et al.

(10) Patent No.: US 6,552,340 B1
(45) Date of Patent: Apr. 22, 2003

(54) AUTOADJUSTING CHARGED-PARTICLE PROBE-FORMING APPARATUS

(75) Inventors: Ondrej L. Krivanek, Sammamish, WA (US); Niklas Dellby, Lake Forest Park, WA (US); Andrew R. Lupini, Hemel Hempstead (GB)

(73) Assignee: Nion Co., Kirkland, WA (US)

( * ) Notice: Subject to any disclaimer, the term of this patent is extended or adjusted under 35 U.S.C. 154(b) by 128 days.

(21) Appl. No.: 09/686,805

(22) Filed: Oct. 12, 2000

(51) Int. Cl.⁷ ............................................... H01J 37/21
(52) U.S. Cl. .................... 250/310; 250/310; 250/307; 250/305; 356/401; 356/372; 356/399
(58) Field of Search ................. 250/310, 311, 250/305, 307, 396 R, 396 ML; 356/401, 372, 399

(56) References Cited

U.S. PATENT DOCUMENTS

| | | | |
|---|---|---|---|
| 4,414,474 A | 11/1983 | Crewe | 250/396 R |
| 5,084,622 A | 1/1992 | Rose | 250/396 R |
| 5,300,776 A | 4/1994 | Krivanek | 250/307 |
| 5,798,524 A * | 8/1998 | Kundmann et al. | 250/305 |
| 6,025,600 A * | 2/2000 | Archie et al. | 250/396 R |
| 6,067,164 A * | 5/2000 | Onoguchi et al. | 356/401 |

OTHER PUBLICATIONS

P. W. Hawkes and E. Kasper, "Principles of Electron Optics" (Academic Press, 1996) vol. 2, Chapter 41.
O.L. Krivanek, N. Dellby and A.R. Lupini, "Towards sub–Å Electron Beams", Ultramicroscopy vol. 78, pp. 1–11 (1999).

* cited by examiner

*Primary Examiner*—Bruce Anderson
*Assistant Examiner*—Zia R. Hashmi

(57) ABSTRACT

An autoadjusting charged-particle probe-forming apparatus improving the resolution of probe-forming charged-particle optical systems by minimizing optical aberrations. The apparatus comprises a source of charged particles, a probe-forming system of charged-particle lenses, a plurality of detectors optionally comprising a two-dimensional image detector, power supplies, a computer and appropriate software. Images are recorded by the two-dimensional detector and analyzed to determine the aberration characteristics of the apparatus. Alternately, multiple scanned images are recorded by a scanned image detector and also analyzed to determine the aberration characteristics of the apparatus. The aberration characteristics are used to automatically adjust the apparatus for improved optical performance.

16 Claims, 4 Drawing Sheets

AUTOADJUSTING CHARGED-PARTICLE PROBE-FORMING APPARATUS

BACKGROUND OF THE INVENTION

1. Field of the Invention

The invention relates to charged-particle optical systems such as electron and ion probe-forming systems, electron and ion microscopes, and electron and ion microanalyzers. It relates particularly to high resolution scanning electron microscopes, high resolution scanning transmission electron microscopes, and to high resolution scanning ion microscopes and microanalyzers.

2. Description of Prior Art

Round electromagnetic and electrostatic lenses typically used in electron and ion microscopes and microanalyzers suffer from unavoidable aberrations such as spherical aberration and chromatic aberration. In the case of scanning electron microscopes and scanning transmission electron microscopes which focus the electron beam into a narrow probe, these aberrations cause the smallest attainable probe size to be about 100 times or more greater than the de Broglie wavelength of the electrons, whereas in a highly perfected optical system the size of the smallest attainable probe should be similar to the de Broglie wavelength. In the case of ion microscopes and microanalyzers, the aberrations cause the ratio of the smallest attainable probe size to the de Broglie wavelength of the ions to be typically one million or more. The result is that the ability of present-day electron and ion microscopes and microanalyzers to probe matter directly on the atomic scale is greatly limited.

A promising approach for overcoming the aberrations is to use non-round lenses such as quadrupoles, sextupoles, octupoles, decapoles, etc. These lenses readily produce aberrations of up to third and higher orders with adjustable polarity and magnitude, as described for instance in chapter 41 in a book entitled Principles of Electron Optics by P. W. Hawkes and E. Kasper, hereby incorporated by way of reference. Despite a prevailing belief, held until recently, that aberration correctors are too complicated and cannot be made to work in practice, as for instance expressed in the book by Hawkes and Kasper, fully working aberration correctors have recently been developed. These correctors successfully minimize aberrations such as spherical aberration, for instance as described in an article entitled "Towards sub-Å electron beams" by O. L. Krivanek, N. Dellby and A. R. Lupini in the journal Ultramicroscopy (volume 78, page 1), hereby incorporated by way of reference. The operation of such aberration correctors is, however, complicated. Although they remove the strong aberrations that are present in round-lens probe-forming systems, they invariably produce a large number (greater than 10) of additional aberrations of different kinds, called parasitic aberrations. The parasitic aberrations arise principally because the elements of a practical corrector cannot be manufactured or aligned to nm-level tolerances, and because magnetic materials used in the construction of the corrector are not homogenous.

The principal effect of each parasitic aberration is to make the probe larger. Suitable auxiliary optical elements can in principle be constructed and energized appropriately to mimmize the effect of an aberration if its type and magnitude are known. Unfortunately, it is typically not possible to determine the type and magnitude of an aberration causing the probe to become larger by examining a single scanned image. Furthermore, in the absence of a means to quantitatively characterize all the parasitic aberrations having an adverse effect on the probe size, the minimization of the deleterious effects of the aberrations cannot be performed, and the overall performance of the optical system typically becomes worse than if no aberration corrector were incorporated.

Since the number of aberrations that need to be considered is large (typically greater than 10), it is highly desirable that the measurement of the aberrations and their minimization be performed automatically. An autoadjusting electron microscope apparatus and method are known from U.S. Pat. No. 5,300,776. This microscope uses a non-scanning parallel illuminating beam and a plurality of beam directions to characterize and automatically adjust the imaging properties of an electron microscope, but the method of the invention is unsuitable for a probe-forming apparatus using a small scanned probe.

Most users of probe-forming electron or ion microscopes and microanalyzers would find significant advantage in a method and an apparatus providing an autoadjusting charged-particle probe-forming apparatus, which minimized all important primary and parasitic aberrations, and was able to adjust its optical elements automatically. They would find significant advantage in the smaller diameter charged-particle probes and improved resolution charged-particle images that such an apparatus would provide, thereby enabling them to explore the structure and composition of matter on the atomic scale with hitherto unattainable resolution and sensitivity. They would also find advantage in the fact that such an autoadjusting charged-particle probe-forming apparatus would allow them to use charged-particle probes of larger angular range without increasing the size of the probe, thereby delivering a larger flux of charged particles to a given area for the purposes of imaging, chemical micro- and nano-analysis, or micro- and nano-machining. Moreover, the users would find significant advantage in an autoadjusting charged-particle probe-forming apparatus able to perform the required set-up in a few seconds to a few tens of seconds using high-end personal computers and a wide variety of practical samples.

OBJECTS AND ADVANTAGES

Accordingly, several of the objects and advantages of the present invention are: to provide a method and an apparatus for an autoadjusting charged-particle probe-forming apparatus that can characterize the aberrations of a charged-particle optical system quantitatively and minimize the effects of the aberrations automatically, to provide charged-particle probes of smaller diameter and of larger current densities than hitherto possible, and to provide charged-particle images of improved resolution.

Readers will find further objects and advantages of the invention from a consideration of the ensuing description and of the accompanying figures.

Figure 1:
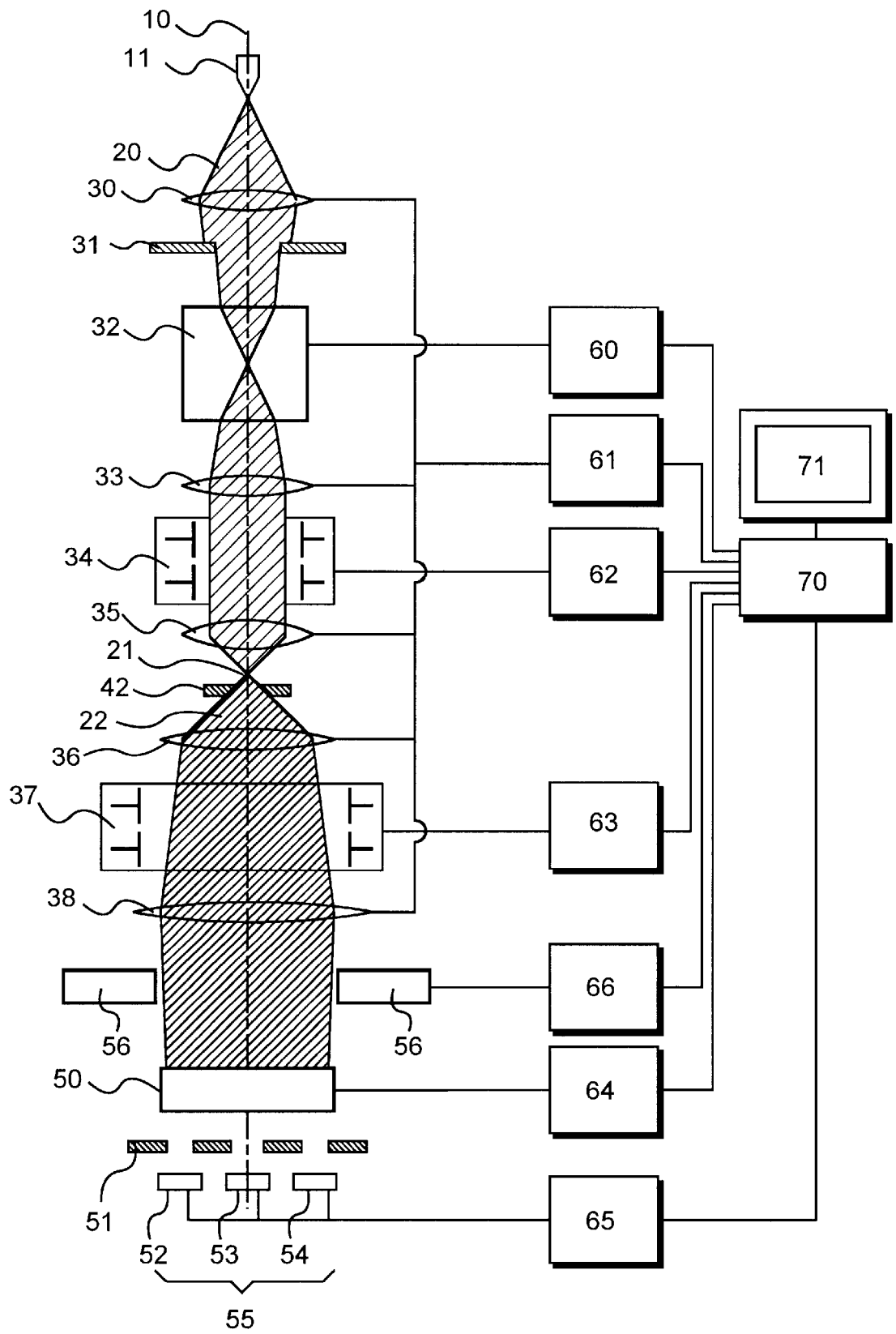
FIG. 1 is a schematic view of an autoadjusting charged-particle probe-forming apparatus of the present invention comprising a source of charged particles, a condenser lens, a beam-defining aperture, an aberration corrector, a coupling lens, a scan and alignment assembly, a probe-forming lens, a sample, a post-sample coupling lens, a post-sample beam deflector, a detector coupling lens, a dark-field detector, a retractable two-dimensional image detector in an inserted position, a bright-field detector array, electronic units, a computer and appropriate software.

DRAWING REFERENCE NUMERALS 10 optic axis
11 charged-particle source
20 charged-particle beam
21 sample-level beam crossover
22 transmitted beam
23 restricted beam
24 secondary charged particle beam
30 condenser lens
31 beam-defining aperture
32 aberration corrector
33 coupling lens
34 scan and alignment assembly
35 probe-forming lens
36 post-sample coupling lens
37 post-sample deflector and alignment assembly
38 detector coupling lens
39 pre-corrector deflector
40 beam-defining aperture
41 mechanical actuator
42 transmission sample
43 bulk sample
50 retractable 2-dimensional imaging detector
51 aperture array
52 bright-field detector
53 bright-field detector
54 bright-field detector
55 bright-field detector array
56 dark-field detector
57 charged-particle detector
60 corrector electronics
61 round lens electronics
62 scan and alignment electronics
63 post-sample deflection electronics
64 2-dimensional imaging detector electronics
65 bright-field detector array electronics
66 dark-field detector electronics
67 charged-particle detector electronics
68 deflector electronics
70 computer
71 computer display

DESCRIPTION

Referring now to FIG. 1, an autoadjusting charged-particle probe-forming apparatus suitable for probe-forming charged-particle optical systems utilizing transmission samples is illustrated schematically. An example of such a system is a high resolution scanning transmission electron microscope (STEM).

Beam of charged particles 20 is emitted by charged-particle source 11 approximately parallel to optic axis 10 which is customarily taken to point in the positive Z direction. The beam is concentrated by condenser lens (or lenses) 30, defined by beam-defining aperture 31, and enters aberration-correcting lens assembly 32. The assembly comprises non-round lenses such as quadrupoles, sextupoles and octupoles, and imparts adjustable aberration properties onto the charged-particle beam. The beam then enters coupling lens (or lenses) 33, scan and alignment assembly 34, and probe-forming lens (or lenses) 35. Lens 35, typically known as objective lens, focuses the beam into a narrow probe incident on transmission sample 42. Lens 35 causes beam 20 to have a narrow waist, also known as a crossover, at point 21 on or near the sample 42. Aberrations due to lens 35 and other pre-sample optical elements are anticipated and canceled by the aberration-correcting assembly 32. Transmitted beam 22 that has traversed transmission sample 42 enters coupling lens (or lenses) 36, and traverses post-sample deflector and alignment assembly 37 and further coupling lens (or lenses) 38. Beam 22 is then incident on 2-dimensional imaging detector 50. A suitable imaging detector 50 is a scintillator that is fiber-optically or lens-optically coupled to a television camera, or to a charge-coupled device (CCD) camera. The resultant image signal is amplified in imaging detector electronics 64 and transmitted to computer 70 having display 71. Charged particles scattered outside transmitted beam 22 are detected by dark field-detector 56. In the preferred configuration of the invention, imaging detector 50 is retractable so that it can be withdrawn allowing transmitted beam 22 to continue to aperture array 51 and bright field detectors 52, 53 and 54. Computer (or computers) 70 also controls power supplies 60, 61, 62 and 63 for optical elements of the charge particle probe-forming apparatus. The apparatus of the invention may also be fitted with various other detectors not shown in the figure, such as high-angle and low-angle dark field detectors, secondary electron detectors, backscatter detectors, X-ray detectors, and other detectors customary in the art.

In order to form a scanned image of sample 42, charged-particle beam 20 is made narrow at sample 42 by suitably energizing lenses 30, 33 and 35 as well as corrector 32 so that beam crossover 21 occurs directly at or near the sample. Scan and alignment assembly 34 is then supplied with saw-tooth ramps which cause the narrow probe to scan over the sample. Suitable scan and alignment assembly comprises deflectors that are electrostatic or electromagnetic dipoles, and are able to deflect the beam in two perpendicular directions. The charged-particle beam incident on the sample is scattered with varying strength from different sample locations. The scattering variations are picked up by a detector such as dark-field detector 56 and other similar detectors well known in the art, amplified by detector electronics 66 and transmitted to computer 70 in which an image of the sample is formed by displaying the variation in intensity of the detected signal as a function of the position of the charged-particle beam on the sample.

An alternate method of imaging sample 42 is to position crossover 21 slightly above or below sample 42, so that a small patch of diameter A of the sample is illuminated by incident beam 21, In this case the beam appears to emanate from a point source, have a finite size at the level of the sample, and to increase in size further away from the sample. The beam next passes through lens (or lenses) 36, deflection and alignment assembly 37, lens (or lenses) 38, and is incident on imaging detector 50 where it illuminates a patch of diameter B, which is recorded as a two-dimensional pattern that is transmitted to computer 70. The resultant image is obtained without needing to scan the charged-particle beam on the sample. Its magnification is given by B/A. The magnification can attain a high value simply by positioning beam crossover 21 close to sample 42 so that A is made very small. The image is formed in a way that is analogous to the imaging of an outline of an object by the shadow formed when the object is illuminated by a point source of short-wavelength radiation, and is therefore often called a shadow image. Alternate names for said image are a far-field diffraction pattern, in-line hologram and further a Ronchigram, based on the fact that the formation of the shadow image is directly analogous to a method for testing telescope mirrors devised by V. Ronchi and described in an article published in Applied Optics vol. 3, p. 437, hereby incorporated by way of reference, In accordance with practices established in charged-particle optics, the aberration properties of the corrector are described by aberration function $_{102}(\theta)$, where $\theta=(\theta_x, \theta_y)$ is the angle between a charged-particle ray traversing the sample and optic axis 10 and the aberration function is defined in the front-focal plane as the physical distance between the actual wavefront converging on the sample and an ideal wavefront that would be obtained in an optical system free of all aberrations. In order to characterize the optical performance of a probe-forming system, the aberration function must be determined experimentally. In the apparatus and method of the invention, the aberration function may be determined using one of several approaches.

First approach makes use of the fact that the local magnification in the Ronchigram appearing on imaging detector 50 is determined by the second derivative of the aberration function as:

$$M = D \begin{pmatrix} \partial^2 \chi(\theta)/\partial \theta_x^2 & \partial^2 \chi(\theta)/\partial \theta_x \partial \theta_y \\ \partial^2 \chi(\theta)/\partial \theta_y \partial \theta_x & \partial^2 \chi(\theta)/\partial \theta_y^2 \end{pmatrix}^{-1} \quad [1]$$

where M is a magnification matrix whose elements are the magnifications in the x, xy, yx and y directions respectively, and the x-, y- coordinates are taken to lie in a plane perpendicular to the optic axis. D is the effective camera length of the far-field diffraction pattern appearing on imaging detector 50, and $\lambda$ the de Broglie wavelength of the charged particle.

In order to determine the local magnification, the charged-particle probe is shifted on the sample by changing the setting of the scan and alignment assembly 34 in such a way that the probe shifts by a calibrated distance defined in the plane of the sample. The shifting is preferably carried out in at least two directions, by distances represented by vectors $p_1$ and $p_2$ defined in the plane of the sample. A suitable calibration may be derived, for instance, by imaging the planes of graphitized carbon spaced by 0.344 nm and comparing the magnitude of the induced shift to the spacing of the carbon planes. A Ronchigram is recorded before and after each shift of the probe. Additional recorded Ronchigrams using more complicated shift patterns may also be employed, so that sample or probe drift unrelated to the intended probe shift may be evaluated and subtracted.

Each recorded Ronchigram is subdivided into I smaller subareas, the center of each subarea corresponding to a particular angle $\theta_i=(\theta_{i,x}, \theta_{i,y})$ at the sample. Suitable patterns for subdividing the Ronchigram are obtained by choosing the subareas to lie on a rectangular grid within the Ronchigram, or spaced around the perimeters of concentric circles. Next, for the pair of Ronchigrams between the recording of which the probe was shifted by $_{p1}$, the displacements occurring between each pair of the same subareas are measured, for instance by cross-correlation, and similarly for the probe shift of $p_2$, the displacements are again measured. The cross-correlation peak may be sharpened by use of suitable image filters before the cross-correlation is worked out, thus leading to more precise values of the displacements. The procedure leads to 4 experimentally determined functions $Q_{1x}$, $Q_{1y}$, $Q_{2x}$ and $Q_{2y}$, where a function $Q_{j,s}$ corresponds to the experimentally measured shift in the s direction when the probe is shifted by $p_j$, and the function values are measured at all the points $\theta_i$.

Next, the functions $Q_{j,s}$ are combined into a matrix Q of size I×4, and the values of axial aberration coefficients are worked out from Q. The coefficients are expressed as $C_{n,m,k}$, where n is the order of the aberration, m is the number of repeats of the aberration when the coordinate system is rotated by 360° ($0 \leq m \leq n+1$), and k can take the value a or b for all coefficients with M>0. The transformation between the matrix Q and the aberration coefficients is derived in a straightforward if lengthy manner by expressing the derivatives of the aberration function appearing in equation [1] above in terms of the aberration coefficients $C_{n,m,k}$. The number I of the image subareas is preferably selected so that matrix Q has more elements than there are coefficients to be determined, and the fitting is performed using a numerical routine minimizing the squares of the fitting errors.

The precision of the experimental measurement of the displacement occurring between corresponding Ronchigram sub-areas may be improved by utilizing a two-pass or multi-pass procedure, whereby the aberration coefficients are worked out as described above, and the values of the coefficients plus the induced probe shift are used to distort ("warp") the experimental Ronchigrams about to be divided into sub-areas for cross-correlation so that each pair of corresponding sub-areas contains a nearly identical image of a portion of the sample, and the cross-correlations carried out a second time. In this way a second-pass matrix Q' is obtained. The aberration coefficients are then once again worked out as described above. The two-pass procedure renders the cross-correlation peaks sharper, and yields more accurate values of the aberration coefficients. Further increases in precision may be obtained by additional passes of the procedure.

Typical total times for the acquisition of the required set of Ronchigrams followed by the derivation of all axial aberration coefficients up to 5-th order are about 5–10 seconds with a fast image detector and a modem personal computer with the described method, and as short as one second or even less if aberrations of only lower orders are considered. Thus the optical state of the probe-forming apparatus of the invention can be characterized in real-time. The precise effects of various optical elements of the apparatus may be quantified by performing a complete characterization of the aberration coefficients, changing the setting of an optical element in a calibrated way, and performing another characterization, repeating the procedure if necessary for improved precision. Optical elements whose action may be calibrated in this way comprise elements of aberration corrector 32 such as multipoles and alignment dipoles, and round lenses and alignment dipoles disposed in the apparatus but outside of the aberration corrector. The procedure may also be used to determine the optic axis of the apparatus, for instance by changing the primary energy of the charged particles or changing the setting of probe-forming lens 35, and determining which part of a Ronchigram recorded after the change has remained stationary relative to a Ronchigram recorded before the change. Once the actions of the optical elements are characterized in this way, a just-determined optical state of the apparatus may be improved automatically, with computer 70 first working out the precise mixture of adjustments needed to minimize the probe-broadening effect of the just-determined aberrations, and then implementing the adjustments by sending appropriate control signals to power supplies 60, 61, 62 and 63.

In order to correct for chromatic aberrations, the energy of the normally monoenergetic charged-particle beam produced by source 11 is changed, and the changes in the set of aberration coefficients $C_{n,m,k}$ up to the desired order are determined. Provided that the corrector comprises elements directly affecting chromatic aberrations, these aberrations are then corrected using a procedure essentially identical to the procedure for the correction of axial aberrations described above.

A second approach to determining the aberration function experimentally is to record an experimental Ronchigram or Ronchigrams, sub-divide each recorded Ronchigram into sub-areas in a manner similar to the first approach, and then to compute the intensity of a Fourier transform of each sub-area, often called a diffractogram. Provided that transmission sample 42 comprises a thin amorphous object and the changes in the local magnification across the selected sub-area are sufficiently small, the Fourier transform then yields a series of bright and dark elliptical rings or hyperbolae, whose positions characterize the second derivative of the aberration function $\chi(\theta)$. In this manner it is possible to determine the local magnification at a number of points in a Ronchigram without displacing the probe on the sample. Once the local magnifications are determined, the determination of aberration coefficients $C_{n,m,k}$ proceeds in a substantially similar manner to the first approach described above. Similar to the two-pass first approach, a two-pass or multi-pass second approach may also be employed, whereby aberration coefficients determined in an earlier pass are used to warp individual Ronchigram sub-areas so that the contributions to the Fourier transform from different portions of each sub-area produce the same pattern of rings rather than a varying one as is the case when the local magnification varies across a sub-area. An advantage of the second approach is that a single Ronchigram may be used to determine the aberration coefficients, and that the results of the approach are not unduly influenced by non-intended movement of the probe relative to the sample caused for instance by thermal drift of the sample or an instability in deflector power supplies.

Figure 2:
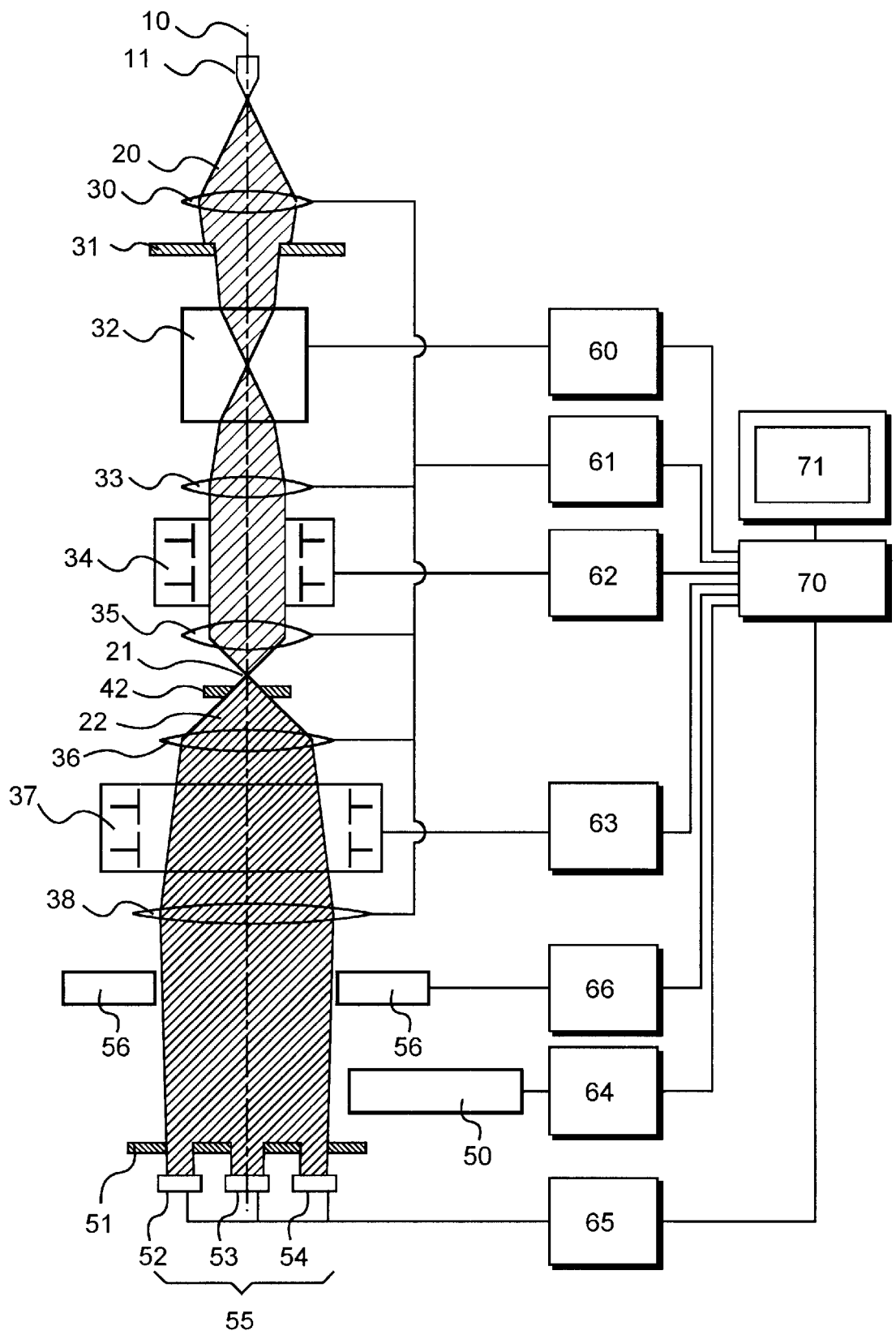
FIG. 2 is a schematic view of an autoadjusting charged-particle probe-forming apparatus of the present invention comprising a source of charged particles, a condenser lens, a beam-defining aperture, an aberration corrector, a coupling lens, a scan and alignment assembly, a probe-forming lens, a sample, a post-sample coupling lens, a post-sample beam deflector, a detector coupling lens, a dark-field detector, a retractable two-dimensional image detector in a retracted position, a bright-field detector array, electronic units, a computer and appropriate software.

FIG. 2 illustrates schematically an apparatus of the invention configured for a third and fourth approach to the determination of aberration coefficients in charged-particle probe-forming apparatus. 2-dimensional imaging detector 50 is removed from the path of the charged particles. Beam 22 is incident on an aperture array 51 that may take the form of a mask containing holes laid out in a well-defined pattern. Portions of the beam selected by aperture array 51 are detected on bright field detectors 52, 53 and 54, together comprising bright-field detector array 55. Signals corresponding to intensities detected by detector array 55 are amplified by bright field detector electronics 65 and sent to computer 70. If narrow crossover 21 of the beam is scanned over the sample, scanned bright-field images may be obtained by capturing and displaying the resultant variations in the detected bright field signals.

A third approach suitable to determining the aberration coefficients is based on the above configuration of the apparatus of the invention and the fact that when the detection angle $\theta$ of a scanned bright-field image is non-zero, image shift d is related to the first derivative of the aberration function by:

$$d = (\partial \chi(\theta)/\partial \theta_x, \partial \chi(\theta)/\partial \theta_y) \quad [3]$$

relative to an image recorded with an on-axis (unshifted) bright field detector. A fourth approach is based on the fact that the apparent defocus $Z_{a,i}$ and astigmatism $A_{a,i}$ of a bright field image recorded with a non-zero detection angle $\theta_i$ are related to the second derivative of the aberration function by:

$$Z_{a,i} = (\partial^2 \chi(\theta)/\partial \theta_x^2 + \partial^2_{102}(\theta)/\partial \theta_y^2)|_{\theta=\theta_i} \quad [4a]$$

$$A_{a,i} = (\partial^2 \chi(\theta)/\partial \theta_y^2 - \partial^2 \chi(\theta)/\partial \theta_x^2, \partial^2 \chi(\theta)/\partial \theta_x \partial \theta_y - \partial^2_{102}(\theta)/\partial \theta_y \partial \theta_x)|_{\theta=\theta_i} \quad [4b]$$

Using either the relationship [3] or relationships [4a, 4b], the first or second derivative of the aberration function can therefore be readily determined for a number of different values of $\theta_i$. The required data set is a tableau of bright field images acquired for different detection angles $\theta_i$. Such a tableau may be acquired in one pass of the beam over the sample using detector array 55 which comprises individual detectors 52, 53 and 54, which intercept different portion of the transmitted beam simultaneously, as shown in FIG. 2. More complicated detectors arrays than the one shown in FIG. 2 may be used, so that information about the aberration function of $\chi(\theta)$ for many different values of $\theta$ is determined simultaneously. Angular increment $\Delta\theta$ between different images in the tableau may be adjusted by changing the setting of coupling lenses 36 or 38. The tableau may also be built up wholly or partly sequentially by acquiring an image or a part of an image with detector 52 or detectors 52 to 54, changing the detection angle using deflectors 37, and acquiring new images for the new detection angle. In this way it is possible to determine $\chi(\theta)$ for many different values of $\theta$ even with a single detector, or to determine $\chi(\theta)$ for more values of $\theta$ than the number of individual detectors in detector array 55. In order to compensate for unintended shifts of the charged-particle probe relative to the sample occurring between images recorded sequentially for different detection angles, the acquisition may be performed in an interleaved manner, that is a smaller portion of each image may be acquired in turn so that the time difference between the different images is minimized.

Once the acquisition of the tableau of images for different detector tilts is completed, the set of displacements $d_i$ is determined in the third approach by cross-correlating the scanned images with a reference central image recorded for detection angle close to zero. In the fourth approach, the second derivative of the aberration function is worked out by computing Fourier transforms of the scanned images, and measuring the apparent defocus $Z_{a,i}$ or apparent astigmatism $A_{a,i}$ by analyzing the resultant pattern of bright and dark elliptical rings or hyperbolae visible in the Fourier transform. The displacement, apparent defocus or apparent astigmatism values determined for different detection angles $\theta_i$ are then grouped into matrices D, Z, or A, and the aberration coefficients $C_{n,m,k}$ are worked out from the matrices in a manner that is substantially the same as the mathematical procedures for manipulating the Ronchigram-derived matrix Q. In this way, the optical performance of the apparatus of the invention is characterized using only scanned images and no 2-dimensional imaging detector. Typical acquisition times for the required data set for these approaches are of the order of tens of seconds, i.e. somewhat slower than the Ronchigram-based approaches, the difference being principally due to the longer time needed to acquire sufficiently noise-free scanned images. Nevertheless, approaches three and four are still sufficiently rapid so that they can be used to calibrate the actions of all the optical elements, and, once these actions are calibrated, to auto-adjust the apparatus for optimum probe-forming performance, using the values of the aberration coefficients just measured.

Figure 3:
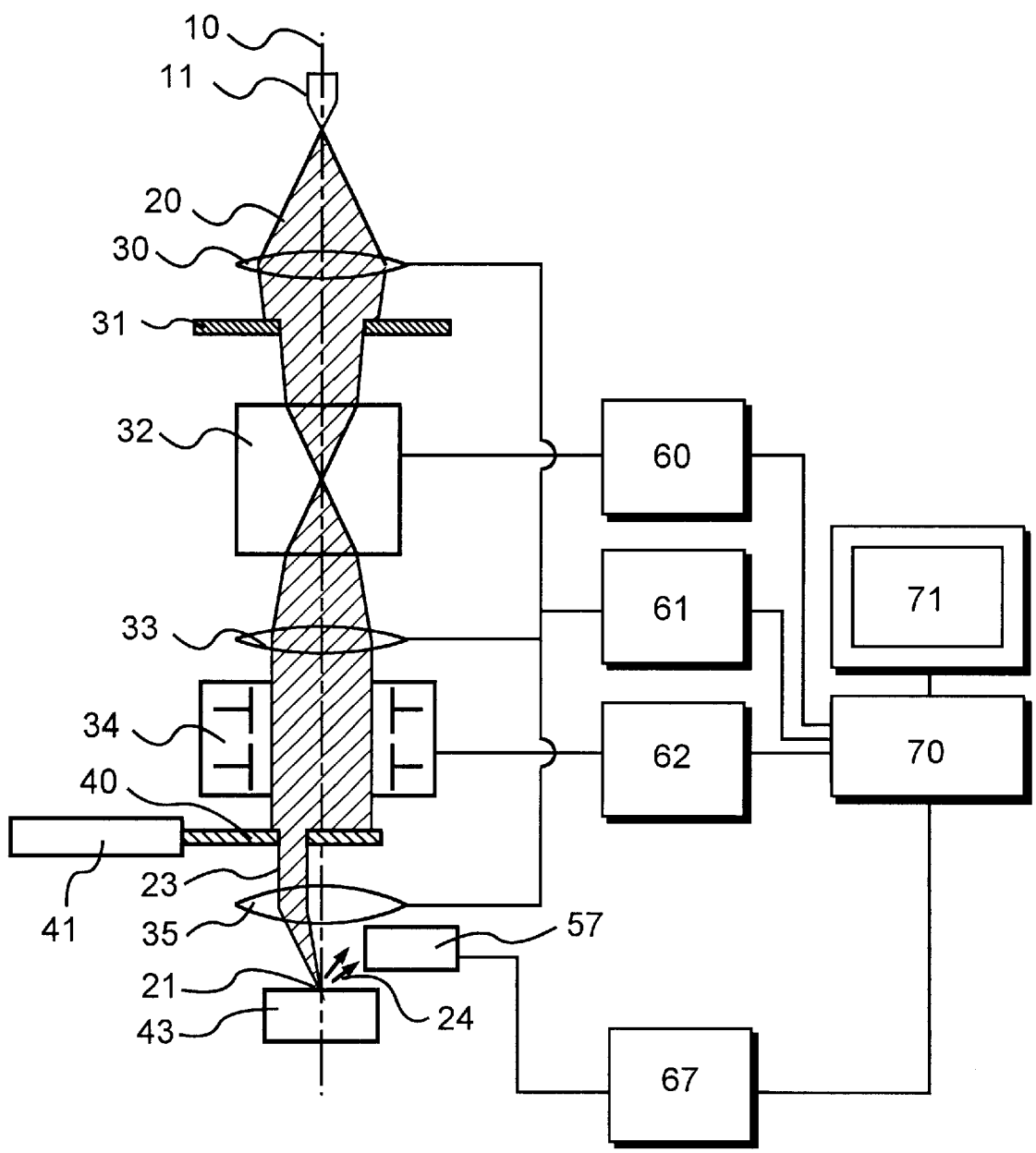
FIG. 3 is a schematic view of an autoadjusting charged-particle probe-forming apparatus of the present invention comprising a source of charged particles, a condenser lens, a beam-defining aperture, an aberration corrector, a coupling lens, a scan and alignment assembly, a beam-defining aperture coupled to a mechanical actuator, a probe-forming lens, a sample, a charged-particle detector, electronic units, a computer and appropriate software.

FIG. 3 illustrates schematically an autoadjusting charged-particle probe-forming apparatus suitable for charged-particle optical systems utilizing bulk samples. Examples of such systems are scanning electron microscopes, and scanning ion microscopes or microanalyzers. A principal difference between such an apparatus and one designed for transmission samples is that beam 20 is stopped by bulk sample 43, and there are no transmitted beam signals available. An image of bulk sample 43 is formed by scanning beam 20 via scan and alignment assembly 34, and detecting secondary charged particles 24 such as secondary or backscattered electrons or ions, represented by short arrows in FIG. 3, by charged-particle detector 57, amplifying the resultant signal by detector electronics 67 and capturing and displaying the resultant image by computer 70 having display 71.

Aberration characterization is achieved by restricting beam 20 by aperture 40 attached to a mechanical actuator 41 such that a only a restricted beam 23 reaches sample 43. The preferred actuator 41 is an electromagnetic actuator with feedback for sensing the position of the aperture. In another embodiment of the invention, the actuator is piezo-driven. Moving aperture 40 to different positions allows the average angle θ' with which sub-beam 23 arrives at the sample to be varied. The aberration function may again be characterized by collecting a tableau of number I of scanned images of varying angle $θ'_i$, and using the relation given in equation [3] above to characterize the aberration function and the aberration coefficients.

Figure 4:
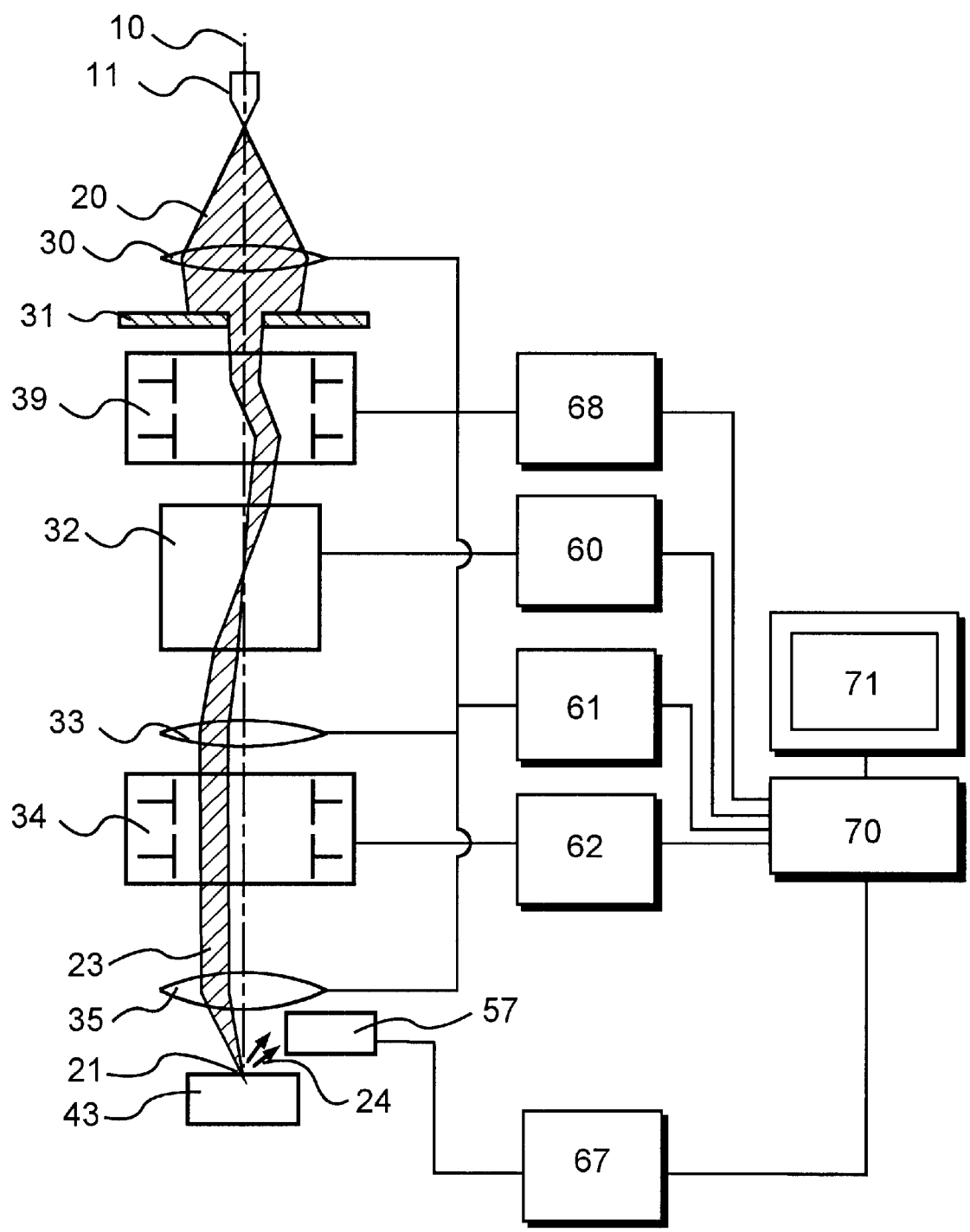
FIG. 4 is a schematic view of an autoadjusting charged-particle probe-forming apparatus of the present invention comprising a source of charged particles, a condenser lens, a beam-defining aperture, a pre-corrector deflector, an aberration corrector, a coupling lens, a scan and alignment assembly, a probe-forming lens, a sample, a charged-particle detector, electronic units, a computer and appropriate software.

FIG. 4 illustrates schematically another embodiment of an autoadjusting charged-particle probe-forming apparatus suitable for charged-particle optical systems utilizing bulk samples. Beam 20 is restricted in size by aperture 31, and a pre-corrector deflector 39 is used to direct restricted beam 23 through corrector 39, coupling lens 33, scan and alignment assembly 34 and probe-forming lens 35 so that the angle of arrival θ' of beam 23 at sample 43 may be varied independently of the scan of the beam over the sample. In this way, the effect of the mechanically moving aperture 40 illustrated in FIG. 3 is reproduced without using any moving parts. The aberration function may then once more be characterized by collecting a tableau of number I of scanned images of varying angle $θ'_i$, and using the relation given in equation [3] above to characterize the aberration function and the aberration coefficients.

Imprecision in simulating the effect of aperture 40 being shifted to different positions when manipulating restricted beam 23 pre-corrector deflector 39 results in additional shifts of the small probe on the sample. However, the additional shifts are related to angle θ' largely in a linear manner. As a consequence, the imprecision results only in an error in the value of first-order aberration coefficients (defocus and regular astigmatism) determined by the aberration-characterizing procedure. The defocus and astigmatism are easily corrected by making scanned images sharper. Higher-order aberration coefficients cannot be readily corrected in such a simple manner, but the values determined by the automated characterization procedure for aberration coefficients of second and higher order are not significantly in error.

Chromatic aberration coefficients and the optic axis of the system may be determined by performing the full aberration-characterization procedure, changing the energy of the charged particles arriving at sample 43, characterizing the aberration coefficients once more, and analyzing the observed differences between the two sets of coefficients. The resultant values are once more not significantly in error when the action of moving aperture 40 is approximated by suitably energizing pre-corrector deflector 39 instead.

While the above description contains many specificities for the purpose of illustrating the invention, other configurations and embodiments may be employed without substantially affecting the apparatus and methods of the invention. As an example, retractable 2-dimensional imaging detector 50 may be fixed in position while bright-field detector array 55 is made retractable, or both detectors 50 and 55 may be fixed in position and the transmitted charged-particle beam may be brought onto one or the other using a suitable beam deflecting means. As another example, analysis of the Ronchigrams may be accomplished using the mathematical technique of wavelet transform, whereby the local magnification or the apparent defocus and astigmatism are worked out without first subdividing the Ronchigram into smaller sub-areas. It will therefore be apparent to those skilled in the art that various changes in the methods and apparatus disclosed herein may be made without departing from the scope of the invention, which is defined in the appended claims.

What is claimed is:

1. A method for autoadjusting a charged-particle apparatus, said method comprising:

emitting a beam of charged particles from a charged particle source;

transferring said beam by charged particle lenses;

forming a narrow probe of charged particles in a vicinity of a transmission sample;

detecting a transmitted Ronchigram image;

quantifying a characteristic property of said Ronchigram;

determining an aberration coefficient or aberration coefficients of said charged-particle apparatus from said characteristic property, whereby information about an optical state of said charged-particle apparatus is determined quantitatively.

2. A method as claimed in claim 1, whereby said characteristic property is magnification at one or a plurality of locations in said Ronchigram image.

3. A method as claimed in claim 2, whereby said magnification is determined by recording a first Ronchigram image, moving said narrow probe relative to said sample, recording a second Ronchigram image, and measuring a change in position of image features between corresponding pairs of sub-areas belonging to said first and second Ronchigram images.

4. A method as claimed in claim 1, whereby said characteristic property is apparent defocus or apparent astigmatism at one or a plurality of locations in said Ronchigramn image.

5. A method as claimed in claim 1, whereby a first Ronchigram image is recorded, an optical setting of said charged-particle apparatus is changed, a second Ronchigram image is recorded, and said characteristic property is quantified by comparing said first Ronchigram image and said second Ronchigram image.

6. A method as claimed in claim 5, whereby said optical setting is primary energy of said charged particle beam, and said characteristic property is a chromatic aberration coefficient or position of an optic axis of said charged-particle apparatus.

7. A method for autoadjusting a charged-particle apparatus, said method comprising:

emitting a beam of charged particles from a charged particle source;

transferring said beam by charged particle lenses;

forming a narrow probe of charged particles in a vicinity of a transmission sample;

scanning said narrow probe over an area of said sample;

detecting a plurality of scanned images with a plurality of bright-field detectors, each detector detecting an image corresponding to a different average detection angle;

quantifying a characteristic property of said plurality of scanned images;

deriving an aberration coefficient or aberration coefficients of said charged-particle apparatus from said characteristic property, whereby information about an optical state of said charged-particle apparatus is determined quantitatively.

8. A method as claimed in claim 7, whereby a single detector or a plurality of detectors is used to detect a number of images corresponding to different average detection angles, with at least one of said detectors sequentially detecting a plurality of scanned images corresponding to different average detection angles, with each said image corresponding to a different setting of a deflection means of said charged-particle apparatus.

9. A method as claimed in claim 7, whereby said characteristic property of said plurality of scanned images is a shift of said images relative to an image recorded with a different detection angle.

10. A method as claimed in claim 7, whereby said characteristic property of said plurality of scanned images is a position of elliptical rings or hyperbolae in Fourier transforms of said images.

11. A method for autoadjusting a charged-particle apparatus, said method comprising:

emitting a beam of charged particles from a charged particle source;

transferring said beam by charged particle lenses;

forming a narrow probe of charged particles in a vicinity of a sample;

scanning said narrow probe over an area of said sample;

recording a plurality of scanned images of said sample with different said images corresponding to different average angles of illumination of said sample;

quantifying a characteristic property of said scanned images;

deriving an aberration coefficient or aberration coefficients of said charged-particle apparatus from said characteristic property, whereby information about an optical state of said charged-particle apparatus is derived automatically.

12. A method as claimed in claim 11, whereby said characteristic property of said scanned images is a shift of said images relative to an image taken with a different average illumination angle.

13. A method as claimed in claim 11 whereby said average angle of illumination is changed by moving an aperture attached to a mechanical actuator.

14. A method as claimed in claim 11 whereby said average angle of illumination is changed by changing a setting of an electromagnetic or electrostatic deflecting means.

15. A method as claimed in claim 11 whereby said plurality of scanned images is formed from a signal generated by a detector detecting charged particles scattered by said sample.

16. A method as claimed in claim 11 whereby said plurality of scanned images is formed from a signal generated by a secondary charged particle detector.

* * * * *